United States Patent
Matsugai

(10) Patent No.: US 8,384,173 B2
(45) Date of Patent: Feb. 26, 2013

(54) SOLID-STATE IMAGING DEVICE AND METHOD FOR MAKING THE SAME, AND IMAGING APPARATUS

(75) Inventor: Hiroyasu Matsugai, Kanagawa (JP)

(73) Assignee: Sony Corporation, Tokyo (JP)

( * ) Notice: Subject to any disclaimer, the term of this patent is extended or adjusted under 35 U.S.C. 154(b) by 307 days.

(21) Appl. No.: 12/783,227

(22) Filed: May 19, 2010

(65) Prior Publication Data

US 2010/0314704 A1 Dec. 16, 2010

(30) Foreign Application Priority Data

Jun. 10, 2009 (JP) ................................. 2009-139352

(51) Int. Cl.
*H01L 31/0232* (2006.01)
(52) U.S. Cl. .................. 257/432; 257/E31.127; 438/60; 438/62; 438/71; 438/72; 438/73
(58) Field of Classification Search .................. 257/432, 257/E31.127, 21.211; 438/60–73, 87
See application file for complete search history.

(56) References Cited

U.S. PATENT DOCUMENTS

| | | | | |
|---|---|---|---|---|
| 7,041,956 B2 * | 5/2006 | Takahashi et al. | ......... | 250/208.1 |
| 7,546,010 B2 * | 6/2009 | Fujii et al. | ....................... | 385/33 |
| 7,973,271 B2 * | 7/2011 | Toumiya et al. | ........... | 250/208.1 |
| 8,043,877 B2 * | 10/2011 | Badehi et al. | ..................... | 438/29 |
| 2001/0053260 A1 * | 12/2001 | Takizawa et al. | ................ | 385/14 |
| 2004/0076375 A1 * | 4/2004 | Imada et al. | ..................... | 385/38 |
| 2004/0076391 A1 * | 4/2004 | Ghoshal et al. | ............... | 385/123 |
| 2005/0123243 A1 * | 6/2005 | Steckl et al. | ..................... | 385/40 |
| 2006/0115230 A1 * | 6/2006 | Komoguchi et al. | ......... | 385/146 |
| 2007/0085215 A1 * | 4/2007 | Budd et al. | ..................... | 257/778 |
| 2007/0237454 A1 * | 10/2007 | Fujii et al. | ........................ | 385/33 |
| 2007/0262366 A1 * | 11/2007 | Baek et al. | ..................... | 257/292 |
| 2007/0275496 A1 * | 11/2007 | Yamashita et al. | .............. | 438/57 |
| 2008/0265353 A1 * | 10/2008 | Komoguchi et al. | ......... | 257/432 |
| 2009/0127442 A1 * | 5/2009 | Lee | .......... | 250/227.11 |
| 2009/0189237 A1 * | 7/2009 | Hirano | .......................... | 257/432 |

FOREIGN PATENT DOCUMENTS

| | | |
|---|---|---|
| JP | 10-326885 | 12/1998 |
| JP | 11-121725 | 4/1999 |
| JP | 2005-294749 | 10/2005 |

* cited by examiner

*Primary Examiner* — N Drew Richards
*Assistant Examiner* — Ankush Singal
(74) *Attorney, Agent, or Firm* — SNR Denton US LLP

(57) ABSTRACT

A solid-state imaging device includes a light receiving unit formed in a semiconductor base and configured to perform photoelectric conversion; an insulating layer disposed on the semiconductor base; a film constituting a cladding of a waveguide together with the insulating layer and being formed in an outer part of an interior of a hole by coating, the hole being formed in the insulating layer above the light receiving unit; a core of the waveguide, the core being composed of a material having a higher refractive index than a material for the insulating layer and a material for the film formed by coating, the core being formed in an inner part of the interior of the hole; and an inner lens integrated with the waveguide, the inner lens having a lens surface formed at the bottom of the hole at the interface between the film formed by coating and the core.

8 Claims, 6 Drawing Sheets

SOLID-STATE IMAGING DEVICE AND METHOD FOR MAKING THE SAME, AND IMAGING APPARATUS

BACKGROUND OF THE INVENTION

1. Field of the Invention

The present invention relates to a solid-state imaging device and a method for making the same, and an imaging apparatus including the solid-state imaging device.

2. Description of the Related Art

Heretofore, various proposals have been made on improvements of sensitivity of solid-state imaging devices. One of such proposals is a waveguide structure in which a hole formed directly above a light receiving unit is filled with a high-refractive-index material (refer to Japanese Unexamined Patent Application Publication Nos. 11-121725, 10-326885, and 2005-294749).

FIG. 5 is a schematic diagram of an example of a solid-state imaging device including a waveguide structure. A light receiving unit (photodiode) 52 is formed in a region isolated by a device isolation layer 53 of a semiconductor substrate 51 such as a silicon substrate. A transfer gate electrode 55 is formed on a gate insulating film 54 on the semiconductor substrate 51 at the left side of the light receiving unit (photodiode) 52. A two-layer wiring layer 58 connected to the semiconductor substrate 51 through a contact layer (conductive plug) 57 is provided. The two-layer wiring layer 58 is covered with an insulating layer 59. A passivation film (protective film) 61, a planarizing film 62, a color filter 63, and an on-chip lens 64 are formed on the insulating layer 59.

A hole formed in the insulating layer 59 above the light receiving unit (photodiode) 52 is filled with a high-refractive-index material layer 60 and constitutes a waveguide. Note that in FIG. 5, an etching stopper film 56 that serves as an etching stopper during formation of the hole in the insulating layer 59 by etching is provided.

The waveguide optically connects the on-chip lens 64 to the light receiving unit (photodiode) 52. Because the high-refractive-index material layer 60 that serves as a core of the waveguide has a refractive index higher than that of the insulating layer 59 serving as a cladding, the incident light having an incident angle greater than the critical angle θ can be totally reflected at the interface between the high-refractive-index material layer 60 and the insulating layer 59. Due to the reflection at the interface, the incident light can be transmitted to the light receiving unit (photodiode) 52 and the efficiency of focusing light on the light receiving unit (photodiode) 52 can be increased.

Japanese Unexamined Patent Application Publication 2005-294749 proposes a structure in which an inner lens having a lens surface at the light receiving unit side is provided above the light receiving unit and the inner lens is formed of a material having a refractive index higher than that of the surrounding layers. According to this structure, the incident light can be focused by the lens surface of the inner lens and guided to the light receiving unit. A hole connected to and provided above the inner lens is filled with a material having a refractive index higher than that of the layers surrounding the hole so as to form a waveguide. As a result, the waveguide can function as a core, the surrounding layers can function as a cladding, and the incident light can be reflected by the side wall of the waveguide and guided to the light receiving unit. Thus, the degree at which incident light is focused on the light receiving unit can be increased and more incident light can be guided into the light receiving unit.

SUMMARY OF THE INVENTION

Various proposals of methods for forming an inner lens above a light receiving unit have been made. For example, a method for forming a lens shape by isotropic etching and a method for forming a lens shape by a reflow process using borophosphosilicate (BPSG) glass and step differences of the wiring have been proposed. However, both methods have a difficulty of controlling the radius of curvature of the lens.

Another proposed method includes forming a lens shape and filling the shape with a high-refractive-index material, such as a nitride film or the like serving as a lens material, by plasma-enhanced chemical vapor deposition (CVD). However, according to this method, it is difficult to fill the shape as the pattern becomes finer and the nitride film formed in other regions has to be removed. Moreover, Although one surface of the inner lens remote from the light receiving unit is desirably flat or convex in shape, such a surface is difficult to form by etching. A chemical mechanical polishing (CMP) technique may be used but has a difficulty of controlling the polishing rate. Thus, it has been difficult to obtain a desired lens shape.

Furthermore, according to the methods proposed heretofore, an inner lens is formed through steps of photolithography, etching, burying, and planarizing. Thus, the number of steps of device production tends to increase and the cost also tends to rise.

It is desirable to facilitate control of the lens shape and provide a solid-state imaging device that can be manufactured easily and exhibits good characteristics, such as high sensitivity, and a method for making such a solid-state imaging device. It is also desirable to provide an imaging apparatus including the solid-state imaging device.

A solid-state imaging device according to one embodiment includes a light receiving unit formed in a semiconductor base and configured to perform photoelectric conversion; an insulating layer disposed on the semiconductor base; a film that constitutes a cladding of a waveguide together with the insulating layer, the film being formed in an outer part of an interior of a hole by a coating technique, the hole being formed in the insulating layer above the light receiving unit; a core of the waveguide, the core being composed of a material having a refractive index higher than that of a material for the insulating layer and that of a material for the film formed by the coating technique, the core being formed in an inner part of the interior of the hole; and an inner lens integrated with the waveguide, the inner lens having a lens surface formed at the bottom of the hole at the interface between the film formed by the coating technique and the core.

A method for making a solid-state imaging device according to another embodiment includes the steps of forming an insulating layer on a semiconductor base in which a light receiving unit configured to perform photoelectric conversion is formed; forming a hole in the insulating layer above the light receiving unit; forming a film that constitutes a cladding of a waveguide together with the insulating layer by a coating technique on a surface of the insulating layer including an inner wall of the hole, the film having a thickness sufficiently smaller than a width of the hole, so as to form a curved surface having a lens shape at a bottom of the hole; forming a layer composed of a material for a core of the waveguide, the material having a refractive index higher than that of a material for the insulating layer and that of a material for the film, the layer covering the entire surface including the interior of the hole; and removing the material for the core from regions other than the interior of the hole.

An imaging apparatus according to another embodiment includes a light-focusing optical unit configured to focus incident light, a solid-state imaging device configured to receive incident light focused by the light-focusing optical unit and perform photoelectric conversion, and a signal processor unit configured to process a signal obtained by photoelectric conversion by the solid-state imaging device. The solid-state imaging device included in this imaging apparatus is the solid-state imaging device having the structure described above.

According to the solid-state imaging device, since a waveguide including a core and a cladding is formed above a light receiving unit, the incident light can be reflected by the outer wall of the waveguide and guided into the light receiving unit.

Since the film formed in the outer part of the interior of the hole in the insulating layer is formed by a coating technique, a curved surface, which forms a lens surface, can be easily formed at the bottom of the hole by the surface tension that occurs due to coating.

Since a lens surface is formed by the interface between the core and the film formed by the coating technique at the bottom of the hole and the inner lens is integrated with the waveguide, the incident light can be focused by the lens surface and guided into the light receiving unit. As a result, the degree at which the light is focused on the light receiving unit can be increased and more incident light can be introduced into the light receiving unit.

According to the method for making the solid-state imaging device described above, a film that constitutes a cladding of a waveguide together with the insulating layer is formed by a coating technique on a surface of the insulating layer including an inner wall of the hole, the film having a thickness sufficiently smaller than a width of the hole, so as to form a curved surface having a lens shape at the bottom of the hole. Thus, a curved surface having a lens shape convex with respect to the lower side (light receiving unit side) is formed by the surface tension of the material for the film formed by the coating technique.

Since a layer composed of a material for a core of the waveguide, the material having a refractive index higher than that of a material for the insulating layer and that of a material for the film is formed to cover the entire surface including the interior of the hole and the material for the core is then removed from regions other than the interior of the hole, the material for the core remains only in the interior of the hole. As a result, a waveguide having a cladding (insulating layer and coating film) and a core inside the cladding is formed.

The imaging apparatus described above can have more incident light guided into the light-receiving unit of a solid-state imaging device since the solid-state imaging device has the structure described above.

According to embodiments of the present invention, the degree of focusing incident light can be increased by the functions of the waveguide and the inner lens and more incident light can be guided into the light receiving unit. Thus, the sensitivity can be improved.

Moreover, since the film that constitutes the cladding of the waveguide together with the insulating layer is formed by coating, a lens shape for the inner lens can be easily formed at the bottom of the waveguide. Accordingly, the control of the lens shape of the inner lens can be facilitated and the solid-state imaging device can be easily made. Moreover, the waveguide and the inner lens can be simultaneously formed to be integrated with each other and the number of process steps can be decreased compare to when the waveguide and the inner lens are formed separately.

According to the imaging apparatus of the embodiment, since the sensitivity of the solid-state imaging device is improved, signals can be sufficiently obtained by photoelectric conversion in the solid-state imaging device. Thus, images can be captured in a relatively dark location. Therefore, an imaging apparatus that has high sensitivity and can capture images in a relatively dark location can be realized.

DESCRIPTION OF THE PREFERRED EMBODIMENTS

Figure 1:
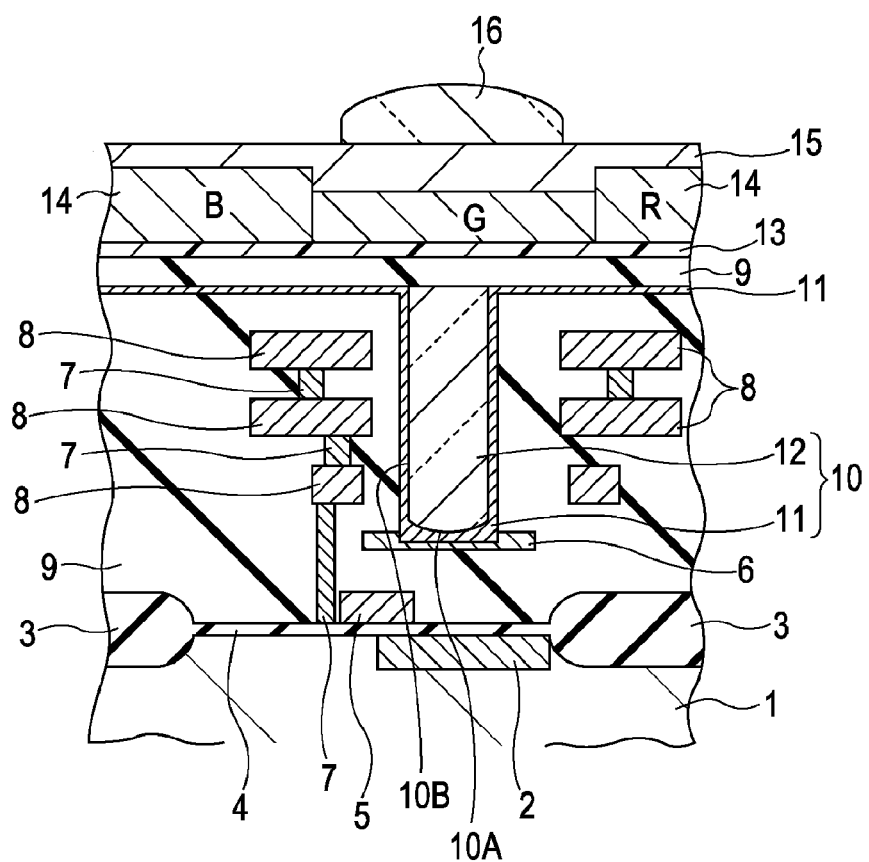
FIG. 1 is a schematic cross-sectional view of a solid-state imaging device according to one embodiment.

Embodiments of the present invention will now be described in detail in the following order:
1. Outline of the invention
2. Embodiments of solid-state imaging device
3. Embodiments of imaging apparatus 1. Outline of the Invention A waveguide including a cladding and a core is formed above a light receiving unit (photodiode) formed in a semiconductor substrate of a solid-state imaging device. An inner lens having a convex lens surface at the light receiving unit side (lower side) is formed. The inner lens is integrated with the bottom of the waveguide. The cladding of the waveguide includes an insulating layer and a film coating the inner wall of a hole formed in the insulating layer above the light receiving unit. Due to the surface tension that occurs during coating, a curved surface which forms a lens surface of the inner lens can be easily formed at the bottom of the waveguide.

In forming the cladding of the waveguide, a film that constitutes the cladding of the waveguide together with the insulating layer is formed on the surface of the insulating layer, the surface including the inner wall of the hole for the waveguide formed in the insulating layer above the light receiving unit. This film is formed by a coating technique and has a thickness sufficiently smaller than the width of the hole. As a result, due to the surface tension of the material constituting this film, the film forms a curved surface, which defines a lens shape that is convex relative to the light receiving unit, at the bottom of the hole.

Since the film is formed by a coating technique, the lens shape for the inner lens can be easily formed at the bottom of the waveguide, thereby facilitating the control of the lens shape of the inner lens.

Subsequently, a layer composed of a material constituting the core of the waveguide (also referred to as the "core material"), the material having a higher refractive index than the materials for the insulating layer and the film, is formed over the entire structure including the interior of the hole. Then the core material that occupies regions other than the hole is removed such that the core material remains only in the hole. As a result, a waveguide having a core surrounded by a cladding can be formed.

As described above, an inner lens that has a lens surface constituted by an interface between the core and the cladding is formed to be integral with the waveguide.

Since incident light is focused by the lens surface of the inner lens integrated with the waveguide and guided into the light receiving unit, the degree of which light is focused at the light receiving unit is increased and more incident light can be guided into the light receiving unit. Thus, the sensitivity of the solid-state imaging device can be improved.

A coating material is used as the material for the film that constitutes the cladding of the waveguide together with the insulating layer in order to form a lens surface by utilizing the surface tension. Examples the coating material include spin-on glass (SOG), inorganic siloxane, organic siloxane, polyimide, polybenzoxazole, and organic films.

Since the cladding has a refractive index lower than that of the core, the material for the film is selected by considering the refractive index of the material for the core. The refractive index of the material for the cladding is lower than that of the material for the core and is thus about the same as the refractive index of the material for the surrounding insulating layer. For example, when SOG is used as the material for the film, the refractive index of the layer formed thereby is about 1.40 to 1.45, which is close to the refractive index (1.46) of the silicon oxide layer formed of TEOS used in the surrounding insulating layer.

Various materials having high refractive indices are used as the material for the core of the waveguide so that the refractive index of the material for the core is higher than that of the materials for the surrounding insulating layer and the film of the cladding. Examples thereof include resins having relatively high refractive indices such as polyimide resins (refractive index n=1.65), polybenzoxazole (n=1.7), siloxane (n=1.5), $TiO_2$-containing siloxane (n=1.7), and organic resins (n=1.65); and metal oxides having relatively high refractive indices such as $TiO_2$ (n=2.0) and $Ta_2O_5$ (n=2.16).

The material for the core of the waveguide may be a coating material, as with the film of the cladding. When the core is formed of a coating material, the same coating apparatus an be used to form the film of the cladding and the core and the coating steps of forming the film of the cladding and the core can be performed continuously.

The material for the core of the waveguide is not limited to a coating material and may be any material that can fill the interior of the hole. For example, the core can be formed by filling the interior of the hole by an atomic layer deposition (ALD) technique, a chemical vapor deposition technique (CVD), or the like.

When siloxane (inorganic or organic siloxane) is used as the material for the film of the cladding of the waveguide, the adhesive force between the film of the cladding and the materials constituting the surrounding insulating layer and the core can be improved since siloxane contains a large number of OH groups bonded to silicon. This is not limited to siloxane and when a material having a reactive group is used in the film of the cladding, the adhesive force between the film of the cladding and the materials for the insulating layer and the core can be improved.

According to the methods for forming the inner lens proposed heretofore, control of the radius of curvature of the lens is difficult as described above, causing variation in the lens effects among pixels and variation in lens effects among wafers.

In contrast, according to the present invention, since an inner lens is formed by the surface tension of the coating film at the bottom of the hole for the waveguide, the radius of curvature of the inner lens can be made uniform, the lens effects can be made uniform, and the shape of the inner lens can be easily controlled.

Since the waveguide and the inner lens are integrally formed, the waveguide and the inner lens can be simultaneously formed. When compared to the case where the waveguide and the inner lens are formed separately, the reflection at the interface can be suppressed, the sensitivity can be improved, and the number of production steps can be significantly reduced.

Thus, a solid-state imaging device including a waveguide and an inner lens can be easily fabricated in fewer steps.

According to the structure described above, the radius of the curvature of the inner lens can be changed by changing the thickness of the coating film of the cladding. For example, the thinner the film, the smaller the radius of the curvature of the inner lens.

The wettability between the outer wall of the hole and the insulating layer changes according to the baking temperature of the coating film, the type of solvent, etc. This can also be used to change the radius of the curvature of the inner lens. Accordingly, since the radius of curvature can be flexibly changed by selecting the thickness of the coating, the baking temperature, and the type of solvent, the degree of freedom of design of the inner lens is increased.

The coating film of the cladding is formed to be sufficiently thin compared to the width of the hole in order to form a lens surface at the bottom of the hole by using the surface tension. The thickness of the coating film may be about 1/10 of the width of the hole.

In view of the present and future pixel sizes of the solid-state imaging devices, the width of the hole for the waveguide is generally in the range of 0.1 μm to 2 μm. Then when the thickness of the coating film of the cladding is controlled in the range of 1 nm to 100 nm, the coating film can be satisfactorily formed on the inner wall of the hole and the lens surface can be formed without any problem.

When the inner lens is formed by utilizing the step difference or the reflow process as in the related art, the radius of curvature of the inner lens is in a particular range and thus the distance between the light receiving unit and the inner lens for focusing the incident light on the light receiving unit (photodiode) is substantially determined.

In contrast, according to the above-described structure, the radius of curvature of the inner lens can be changed highly flexibly and thus the distance between the inner lens and the light receiving unit can be changed according to the radius of curvature of the inner lens. Thus, the degree of freedom for determining the distance between the inner lens and the light receiving unit is also increased.

For example, when the radius of curvature of the inner lens is small, the depth of focus is large. Thus, the bottom of the hole for forming the waveguide can be made remote from the light receiving unit. When the light receiving unit is remote from the bottom of the hole, the damage on the semiconductor base caused by charges generated by plasma during etching for forming the hole can be further decreased.

The solid state imaging element is used in an imaging apparatus. Accordingly, the sensitivity of the solid-state imaging device can be improved and sufficient signals can be obtained by photoelectric conversion in the solid-state imaging device. Thus, an imaging apparatus that has high sensitivity and can capture images in a relatively dark location can be realized.

2. Embodiments of Solid-State Imaging Device

FIG. 1 is a schematic diagram (cross-sectional view) of a solid-state imaging device according to one embodiment. FIG. 1 is a cross-sectional view showing one pixel of the solid-state imaging device. This embodiment involves a solid-state imaging device of a complementary metal oxide semiconductor (CMOS) type.

In a pixel of this solid-state imaging device, a light receiving unit (photodiode) 2 in which photoelectric conversion is performed is formed in a semiconductor substrate 1 such as a silicon substrate in a region isolated by a device isolation layer 3. A transfer gate electrode 5 is formed on a gate insulating film 4 on the semiconductor substrate 1 at the left side of the light receiving unit (photodiode) 2. Three wiring layers 8 are connected to the semiconductor substrate 1 through contact layers (conductive plugs) 7 and covered with an insulating layer 9. A passivation film (protective film) 13, a three-color (red (R), green (G), and blue (B)) filter 14, a planarizing film 15, and an on-chip lens 16 are formed on the insulating layer 9.

In this embodiment, a waveguide 10 integral with an inner lens is formed by filling the interior of the hole (groove) formed in the insulating layer 9 above the light receiving unit 2. The waveguide 10 includes a film 11 disposed in the outer part of the interior of the hole in the insulating layer 9, and a core 12 having a refractive index higher than that of the surrounding insulating layer 9 and the film 11, the core 12 being formed at the inner side of the film 11. The cladding of the waveguide 10 includes the surrounding insulating layer 9 and the film 11 coating the inner wall of the hole. The film 11 preferably has a refractive index lower than that of the core 12 but equal to or more than the refractive index of the surrounding insulating layer 9.

A curved surface that is convex relative to the light receiving unit 2 side (lower side) is formed by the interface between the core 12 and the film 11 at the bottom of the waveguide 10. The curved surface constitutes a lens surface 10A of an inner lens.

The coating material described above is used as the material for the film 11 of the waveguide 10. For example, inorganic siloxane, organic siloxane, polyimide, polybenzoxazole, organic films, and the like can be used. When a coating material is used as the material for the film 11, the shape of the lens surface 10A can be imparted to the surface of the film 11 at the bottom of the hole using the surface tension generated when the coating material is coated.

Various types of materials having high refractive indices described above may be used as the material for the core 12 of the waveguide 10. Examples thereof include resins having relatively high refractive indices such as polyimide resins (refractive index n=1.65), polybenzoxazole (n=1.7), siloxane (n=1.5), $TiO_2$-containing siloxane (n=1.7), and organic resins (n=1.65); and metal oxides having relatively high refractive indices such as $TiO_2$ (n=2.0).

Since the refractive index of the core 12 inside the waveguide 10 is higher than that of the surrounding cladding (the insulating layer 9 and the film 11), incident light is reflected by the core 12 inside the waveguide 10 and the surrounding cladding at a side wall surface 10B shown in FIG. 1. Accordingly, the incident light can be guided toward the light receiving unit 2 through the waveguide 10.

The solid-state imaging device of this embodiment may be made, for example, by the following method.

Figure 2A:
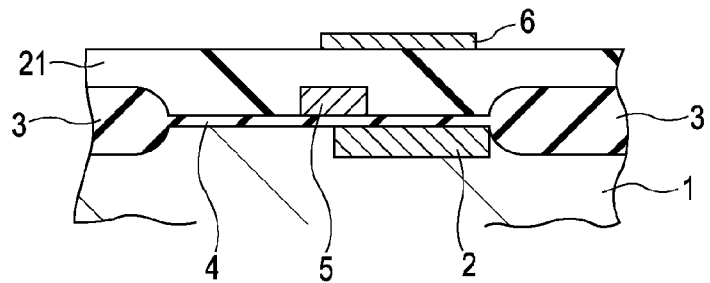
FIGS. 2A to 2C are cross-sectional views showing steps of a method for making the solid-state imaging device shown in FIG. 1.

First, as in the method of the related art, a light receiving unit (photodiode) 2 is formed in a semiconductor substrate 1 composed of, for example, silicon, and a transfer gate electrode 5 is formed on a gate insulating film 4 of the semiconductor substrate 1. Then an insulating layer 21 such as a silicon oxide layer, for example, is formed to cover the transfer gate electrode 5. Then, for example, a silicon nitride film is formed by a plasma process on the insulating layer 21 and patterned so that some of the silicon nitride film remains above the light receiving unit 2 to form an etching stopper film 6 (refer to FIG. 2A for steps up to this).

Figure 2B:
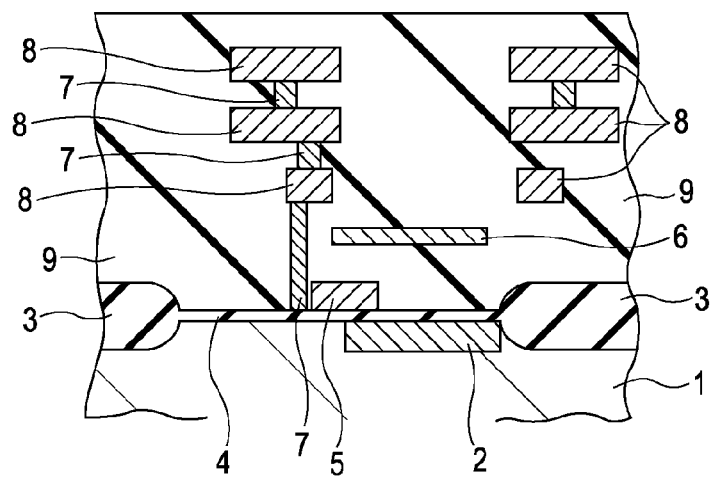

An interlayer insulating film, contact layers 7, and wiring layers 8 are sequentially formed and the entire structure is covered with an insulating layer. As a result, as shown in FIG. 2B, the etching stopper film 6, the contact layers (conductive plugs) 7, and the wiring layers 8 are covered with the insulating layer 9.

Figure 2C:
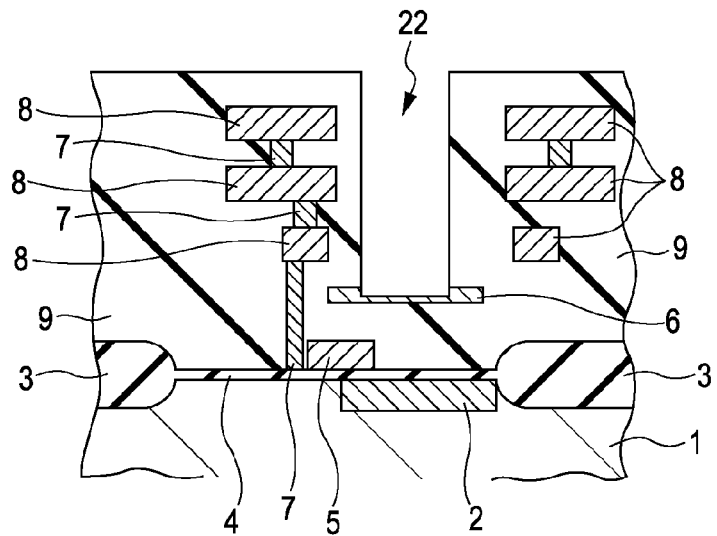

Then as shown in FIG. 2C, a hole 22 that will form a waveguide is formed in the insulating layer 9 by anisotropic etching. The anisotropic etching is conducted by reactive ion etching (RIE) using $C_4F_8$, $O_2$, and Ar, for example.

During the anisotropic etching, a hole 22 is formed down to just above the etching stopper film 6 or to a middle of the etching stopper film 6. In FIG. 2C, the hole 22 is formed down to the middle of the etching stopper film 6.

An etching selective ratio of about 10 can be ensured between the insulating layer (e.g., silicon oxide layer) 9 and the etching stopper film (plasma silicon nitride film) 6.

A film 11 for forming an inner lens is formed on the inner wall of the hole 22 by a coating technique. Examples of the material for the film 11 include the coating materials described above, such as inorganic siloxane, organic siloxane, polyimide, polybenzoxazole, and organic films.

Figure 3A:
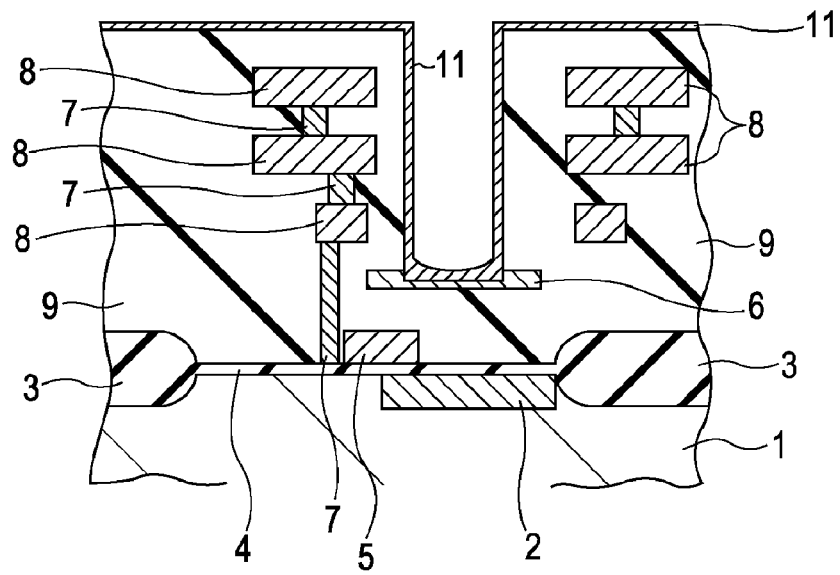
FIGS. 3A and 3B are cross-sectional views showing steps of the method for making the solid-state imaging device shown in FIG. 1.

Coating of the material for the film 11 is performed so that the thickness is about 1 nm to 100 nm. When a thin film having a thickness of about 1 nm to 100 nm is formed in the hole 22, the material for the film 11 stays on the bottom of the hole 22 and due to the surface tension acting between the material for the film 11 and the insulating layer 9, a shape having a radius of curvature can be obtained (refer to FIG. 3A)

Figure 3B:
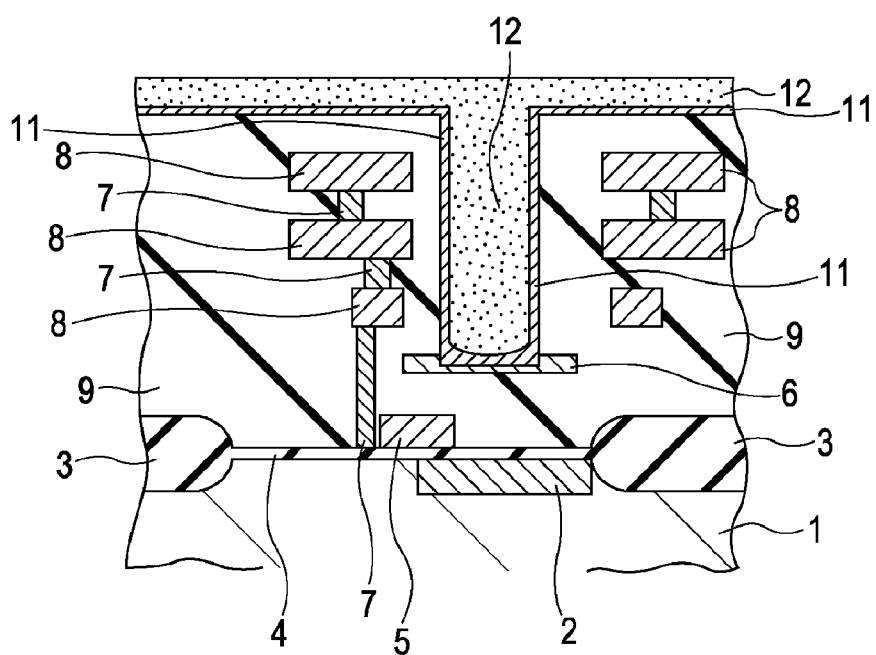

Then as shown in FIG. 3B, the hole 22 is filled with a material having a high refractive index to form a core 12. For example, a polyimide resin is filled in the hole 22 by a coating technique. During this process, the material for the film 11 previously formed remains at the bottom of the hole 22 by forming a controlled radius of curvature. Thus, the bottom of the core 12 has a lens shape.

Figure 4A:
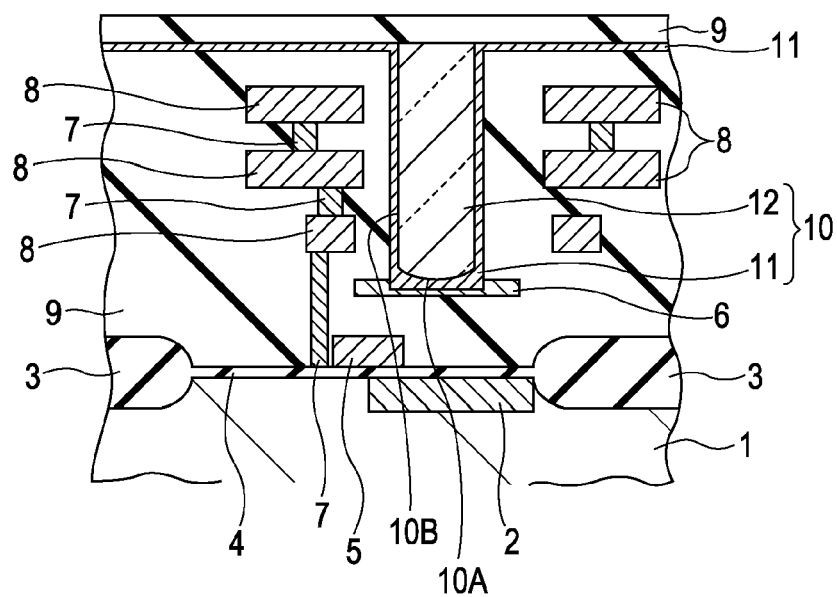
FIGS. 4A and 4B are cross-sectional views showing steps of the method for making the solid-state imaging device shown in FIG. 1.

The material for the core 12 on the surface of the insulating layer 9 is completely removed by an etching back method or chemical mechanical polishing (CMP) to conduct a global planarization treatment. As a result, as shown in FIG. 4A, the material for the core 12 remains only in the interior of the hole 22 and a waveguide 10 is formed by the cladding (the insulating layer 9 and the film 11) and the core 12. Note that the material for the core 12 on the surface of the insulating layer 9 does not have to be removed.

As shown in FIG. 4A, an insulating layer 9 is formed over the entire surface to bury the waveguide 10 in the insulating layer 9.

Figure 4B:
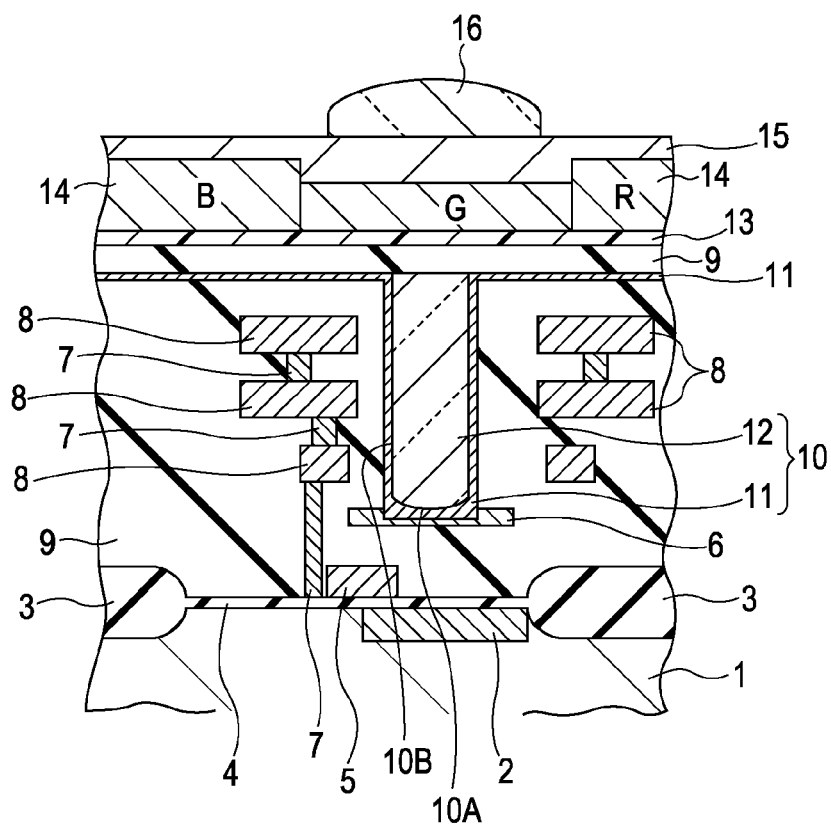
Figure 5:
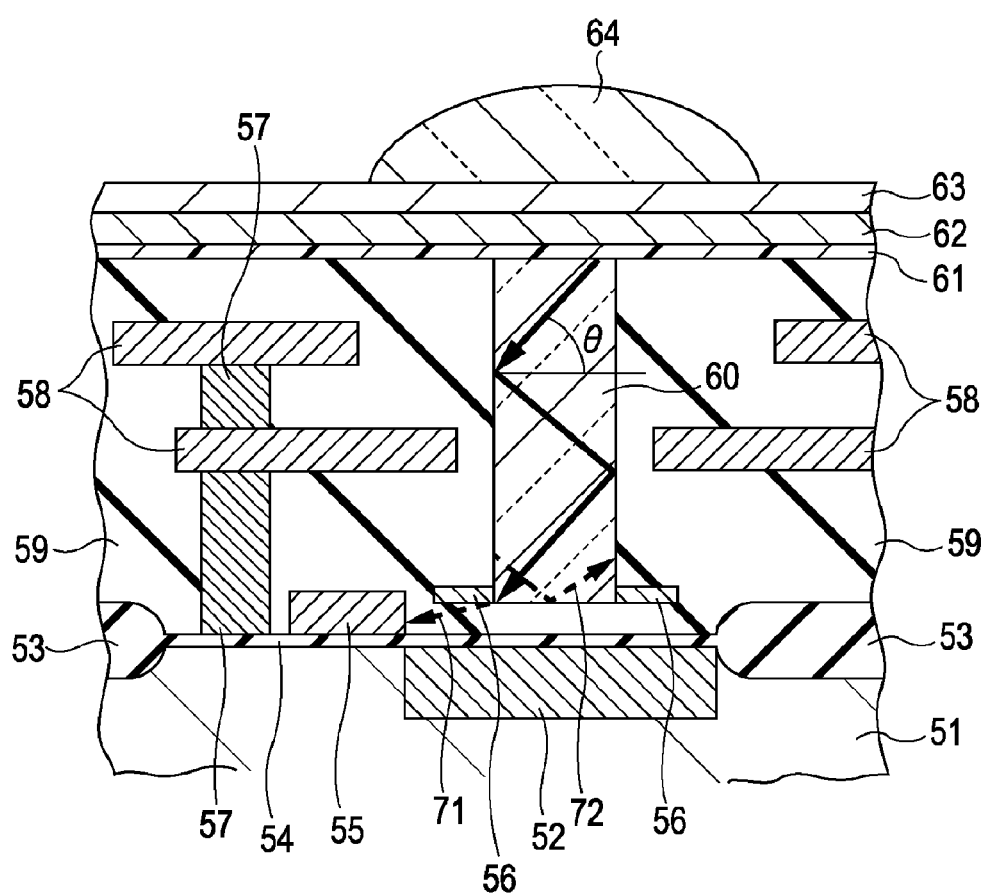
FIG. 5 is a schematic cross-sectional view of one example of a solid-state imaging device including a waveguide.

Then as in the production method of the related art, a passivation film (protective film) 13, a color filter 14, a planarizing film 15, and an on-chip lens 16 are sequentially formed as shown in FIG. 4B. As a result, a solid-state imaging device shown in FIG. 1 is made.

According to this embodiment, an inner lens having a lens surface 10A at the light receiving unit 2 side is formed above the light receiving (photodiode) unit 2, and this inner lens is composed of a material for the core 12 of the waveguide 10, i.e., a material having a higher refractive index than the surrounding insulating layer 9. Accordingly, the incident light can be focused by the lens surface 10A and guided into the light receiving unit 2.

Furthermore, since the cladding (the insulating layer 9 and the film 11) and the core 12 constitute the waveguide 10 integral with the inner lens, the incident light can be reflected at the side wall surface 10B of the waveguide 10 and guided into the light receiving unit 2 through the inner lens.

Thus, the degree of focusing the incident light on the light receiving unit 2 can be increased and more light can be guided into the light receiving unit 2. Thus, the sensitivity can be improved.

According to this embodiment, an inner lens is formed at the bottom of the waveguide 10 and is composed of the same material as the waveguide 10 so as to be integral with the waveguide 10. As a result, reflection and interference at the interface between the waveguide and the inner lens, which occur when the interior of the waveguide and the interior of the inner lens are composed of materials having different refractive indices, can be suppressed. Thus, the loss caused by reflection and interference at the interface between the waveguide and the inner lens can be reduced and the degree of focusing light can be improved.

According to this embodiment, since the waveguide 10 and the inner lens are integrally formed, the waveguide 10 and the inner lens can be formed simultaneously. When compared to the case where the waveguide and the inner lens are formed separately, the number of production steps can be significantly reduced and a solid-state imaging device including both the waveguide and the inner lens can be easily made through fewer steps.

When the material for the film 11 contains a component that is adhesive to the insulating layer 9, a function of increasing the adhesive force can also be imparted to the film 11. When a small number of reactive groups are present, the adhesive force between the material for the film 11 and the material for the insulating layer 9 is degraded. However, when, for example, siloxane (inorganic or organic siloxane) is used in the film 11, the number of OH groups bonded to silicon increases and the adhesiveness improves by thermal decomposition. Note that this effect is not limited to siloxane. A material containing reactive groups may be used in the film 11 so that the film 11 has a similar function of increasing the adhesive force.

In the embodiment described above, as shown in FIG. 1, the light receiving unit (photodiode) 2 is formed in the semiconductor substrate 1 such as a silicon substrate. Alternatively, a semiconductor base including a semiconductor substrate and a semiconductor epitaxial layer on the semiconductor substrate may be used instead of the semiconductor substrate described above, and a light receiving unit (photodiode) may be formed in the semiconductor epitaxial layer. Alternatively, a semiconductor other than silicon may be used as the semiconductor base.

In the embodiment described above, the etching stopper film 6 is formed as a stopper in forming the hole 22 in the insulating layer 9 by etching. However, the etching stopper film is not an essential member and a hole for a waveguide may be formed without providing an etching stopper. An advantage of providing an etching stopper film is that the depth of the hole for forming the waveguide can be controlled to a particular depth.

Although the embodiment is directed to a CMOS solid-state imaging device, the embodiment may be directed to solid-state imaging devices of other structures. For example, a charge coupled device (CCD)-type solid image device may be provided which includes an inner lens integral with a waveguide at the bottom of the waveguide. The same effects can be obtained from this device also.

3. Embodiments of Imaging Apparatus

Next, embodiments of an imaging apparatus are described.

Figure 6:
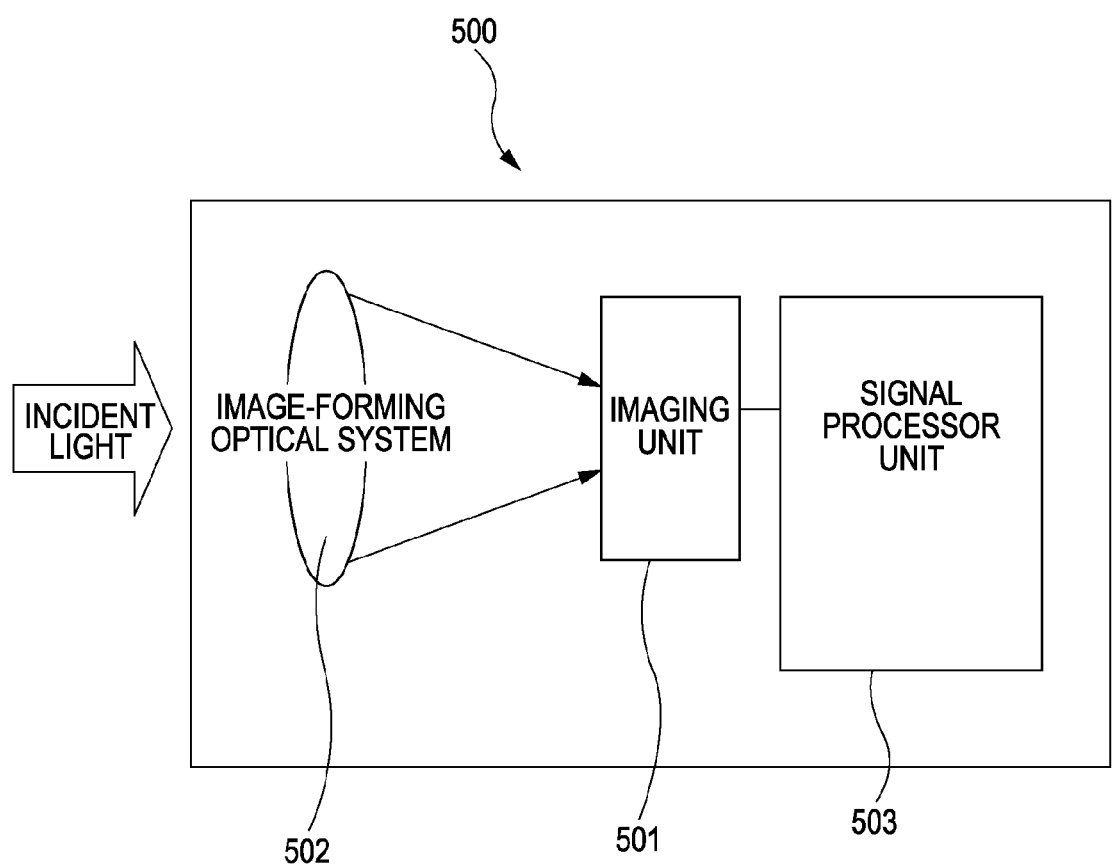
FIG. 6 is a schematic block diagram showing an imaging apparatus according to one embodiment.

FIG. 6 is a schematic diagram showing an embodiment of an imaging apparatus.

This imaging apparatus may be a video camera, a digital still camera, a cellular phone camera, or the like.

Referring to FIG. 6, an imaging apparatus 500 includes an imaging unit 501 including a solid-state imaging device (not shown). An image-forming optical system 502 that forms an image by focusing the incident light is provided at the front stage of the imaging unit 501. A signal processor unit 503 including a driving circuit for driving the imaging unit 501, a signal processor circuit for processing signals, which have been photoelectrically converted by the solid-state imaging device, into an image, and the like is connected behind the imaging unit 501. The image signals processed by the signal processor unit 503 may be stored in an image memory unit (not shown).

In this imaging apparatus 500, a solid-state imaging device such as one described above as an embodiment can be used as the solid-state imaging device.

Since the imaging apparatus 500 includes a solid-state imaging device including an inner lens integral with a waveguide and thus having an improved sensitivity as described above, images can be captured in a relatively dark place.

The imaging apparatus is not limited to one having a structure shown in FIG. 6 and may be any imaging apparatus including a solid-state imaging device. For example, a solid-state imaging device may be formed as a single chip or may be packaged into a module together with an imaging unit, a signal processor unit, an optical system, etc., so as to exhibit an image capturing function.

The imaging apparatus may be applied to various imaging apparatuses such as a camera, a portable appliance having an imaging function, etc. The term "imaging" includes fingerprint detection.

The present invention is not limited by the embodiments described above and can take various forms without departing the scope of the invention.

The present application contains subject matter related to that disclosed in Japanese Priority Patent Application JP 2009-139352 filed in the Japan Patent Office on Jun. 10, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a light receiving unit formed in a semiconductor base and configured to perform photoelectric conversion;
   an insulating layer disposed on the semiconductor base, the insulating layer having an opening above the light receiving unit;
   a film coating side walls and a flat bottom surface of the opening, the film having a thickness in a range of 1 nm to 100 nm to provide the film with a curved surface, the curved surface being a concave surface facing an interior of the opening resulting from a surface tension characteristic of the film;

a core of a waveguide, the core being composed of a material having a refractive index higher than that of a material for the insulating layer and that of a material for the film, the core being on the film and filling the opening; and an inner lens integrated with the waveguide, the inner lens having a lens surface that comprises the curved surface wherein, the insulating layer and the film constitute a cladding of the waveguide.

2. The solid-state imaging device according to claim 1, wherein the material for the film is siloxane.

3. The imaging apparatus of claim 1, wherein the insulating layer and the film constitute a cladding of the waveguide.

4. A method for making a solid-state imaging device, comprising the steps of:

forming an insulating layer on a semiconductor base in which a light receiving unit configured to perform photoelectric conversion is formed;

forming an opening in the insulating layer above the light receiving unit;

coating sidewalls and a flat bottom surface of the opening with a film, the film having a thickness in a range of 1 nm to 100 nm to provide the film with a curved surface, the curved surface being a concave surface facing an interior of the opening resulting from a surface tension characteristic of the film;

forming a layer composed of a material for a core of a waveguide, the material having a refractive index higher than that of a material for the insulating layer and that of a material for the film, the layer being on the film and filling the opening; and removing the material for the core from regions other than the interior of the hole, wherein, the insulating layer and the film constitute a cladding of the waveguide.

5. The method according to claim 4, wherein the width of the hole is within the range of 0.1 μm to 2 μm.

6. The method according to claim 4, wherein the core is formed by a coating technique.

7. The method according to claim 4, wherein the material for the film is siloxane.

8. An imaging apparatus comprising:

a light-focusing optical unit configured to focus incident light;

a solid-state imaging device including a light receiving unit formed in a semiconductor base and configured to perform photoelectric conversion, an insulating layer disposed on the semiconductor base, the insulating layer having an opening above the light receiving unit, a film coating side walls and a flat bottom surface of the opening, the film having a thickness in a range of 1 nm to 100 nm to provide the film with a curved surface, the curved surface being a concave surface facing an interior of the opening resulting from a surface tension characteristic of the film;

a core of a waveguide, the core being composed of a material having a refractive index higher than that of a material for the insulating layer and that of a material for the film, the core being on the film and filling the opening, and an inner lens integrated with the waveguide, the inner lens having a lens surface that comprises the curved surface; and a signal processor unit configured to process a signal obtained by photoelectric conversion by the solid-state imaging device.

\* \* \* \* \*